(12) United States Patent
Tweet et al.

(10) Patent No.: US 8,106,426 B2
(45) Date of Patent: Jan. 31, 2012

(54) FULL COLOR CMOS IMAGER FILTER

(75) Inventors: Douglas J. Tweet, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 539 days.

(21) Appl. No.: 12/029,431

(22) Filed: Feb. 11, 2008

(65) Prior Publication Data

US 2009/0200584 A1 Aug. 13, 2009

Related U.S. Application Data

(63) Continuation-in-part of application No. 12/025,618, filed on Feb. 4, 2008, now Pat. No. 7,759,756.

(51) Int. Cl.
*H01L 27/148* (2006.01)
(52) U.S. Cl. ........ 257/215; 257/225; 257/233; 257/235; 257/288; 257/291; 257/292; 257/293; 257/431
(58) Field of Classification Search .................. 257/222, 257/292, 225, 231, 233, 235, 257, 288, 290, 257/291, 294, 431, 435, E31.058, E31.063, 257/E31.121, E27.133, E27.134, E25.004, 257/E25.009, 910
See application file for complete search history.

(56) References Cited

U.S. PATENT DOCUMENTS

| 7,129,466 | B2 * | 10/2006 | Iwasaki | 250/214.1 |
| 2004/0178463 | A1 * | 9/2004 | Merrill et al. | 257/440 |
| 2004/0178478 | A1 * | 9/2004 | Shizukuishi | 257/620 |
| 2007/0045682 | A1 * | 3/2007 | Hong et al. | 257/292 |
| 2009/0184349 | A1 * | 7/2009 | Dungan | 257/292 |
| 2011/0133260 | A1 * | 6/2011 | Ko et al. | 257/292 |

OTHER PUBLICATIONS

Murakami et al., "Technologies to Improve Photo-Sensitivity and Reduce VOD Shutter Voltage for CCD Image Sensors", IEEE Transactions on Electronic Devices, vol. 47, No. 8 2000.

* cited by examiner

*Primary Examiner* — N Drew Richards
*Assistant Examiner* — Joannie A Garcia
(74) *Attorney, Agent, or Firm* — Law Office of Gerald Maliszawski; Gerald Maliszewski

(57) ABSTRACT

A full color complementary metal oxide semiconductor (CMOS) imaging circuit is provided. The imaging circuit is made up of an array of photodiodes including a plurality of pixel groups. Each pixel group supplies 3 electrical color signals, corresponding to 3 detectable colors. A color filter array overlies the photodiode array employing less than 3 separate filter colors. Each pixel group may be enabled as a dual-pixel including a single photodiode (PD) to supply a first color signal and stacked PDs to supply a second and third color signal. In one aspect, the color filter array employs 1 filter color per pixel group. In another aspect, the color filter array employees 2 filter colors per pixel group. In either aspect, the color filter array forms a checkerboard pattern of color filter pixels. For example, a magenta color filter may overlie the stacked PDs of each dual-pixel, to name one variation.

15 Claims, 7 Drawing Sheets

Fig. 7C

| R/S | D | R/S |
|---|---|---|
| D | R/S | D |
| R/S | D | R/S |

Fig. 7D

| B/S | D | B/S |
|---|---|---|
| D | B/S | D |
| B/S | D | B/S |

Fig. 7E

| G/S | M/D | G/S |
|---|---|---|
| M/D | G/S | M/D |
| G/S | M/D | G/S |

Fig. 7F

| R/S | C/D | R/S |
|---|---|---|
| C/D | R/S | C/D |
| R/S | C/D | R/S |

Fig. 7G

| B/S | Y/D | B/S |
|---|---|---|
| Y/D | B/S | Y/D |
| B/S | Y/D | B/S |

Fig. 7H

| S | C/D | S |
|---|---|---|
| C/D | S | C/D |
| S | C/D | S |

Fig. 7I

| S | Y/D | S |
|---|---|---|
| Y/D | S | Y/D |
| S | Y/D | S |

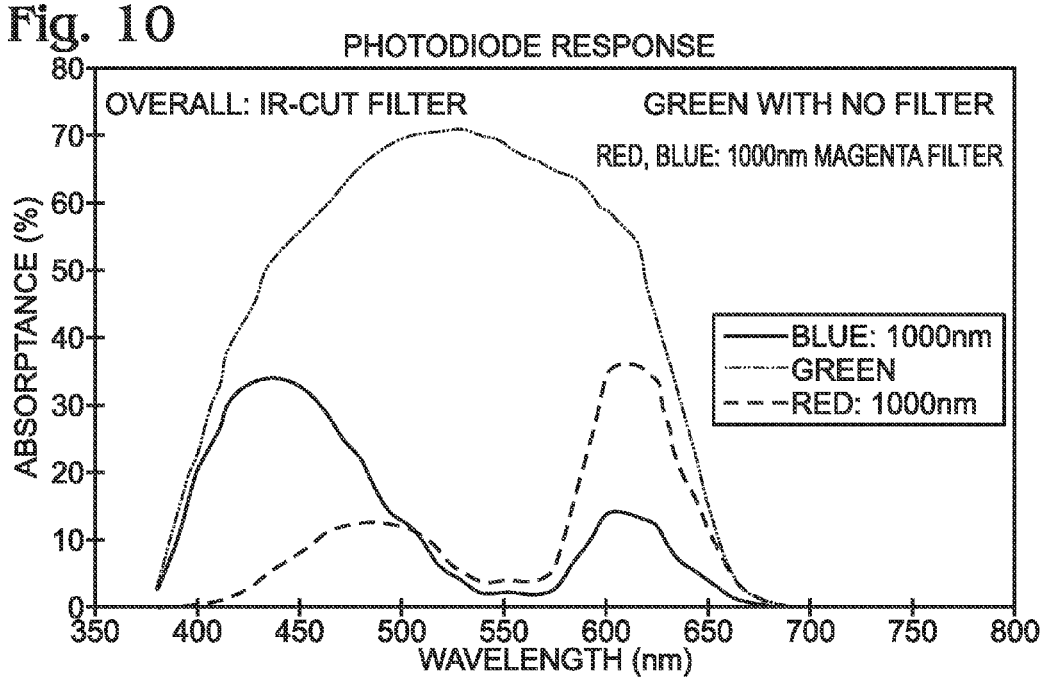
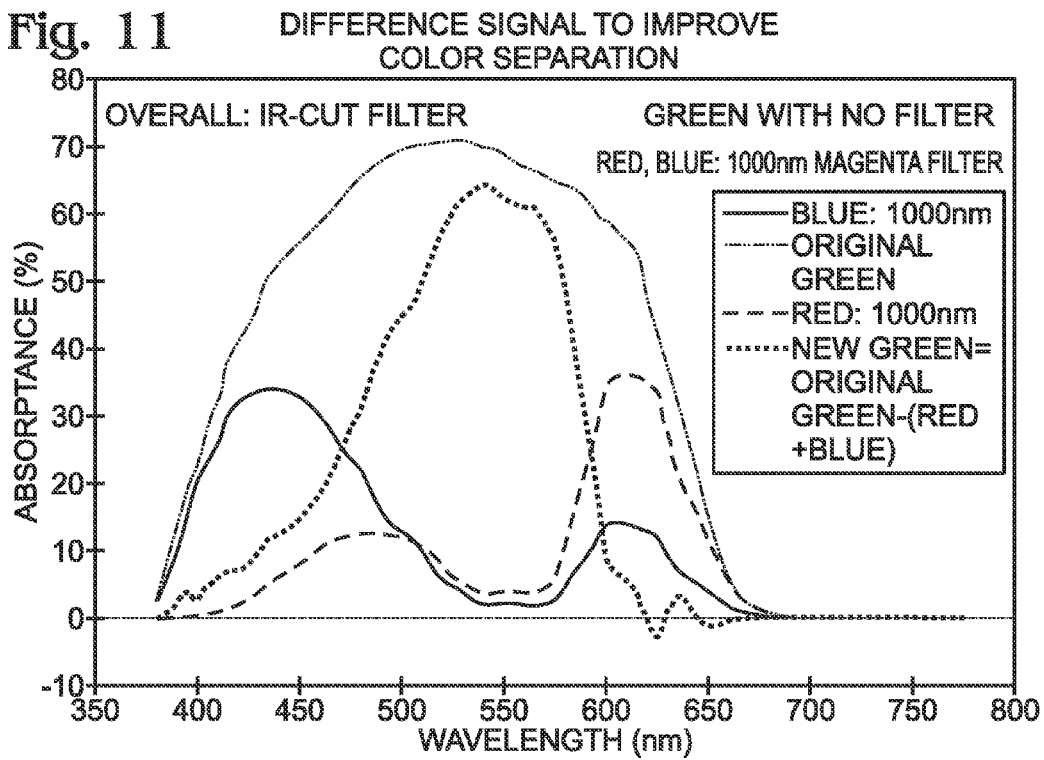

FULL COLOR CMOS IMAGER FILTER

RELATED APPLICATIONS

This application is a continuation-in-part of a pending patent application entitled, DUAL-PIXEL FULL COLOR CMOS IMAGER, invented by Lee et al., Ser. No. 12/025,618, filed Feb. 4, 2008, which is incorporated herein by reference.

BACKGROUND OF THE INVENTION

1. Field of the Invention

This invention generally relates to integrated circuit (IC) fabrication and, more particularly, a dual-pixel full color imager filter.

2. Description of the Related Art

FIG. 1 depicts a complementary metal oxide semiconductor (CMOS) imager with a "buried" or "pinned" photodiode (prior art). Conventionally, the image cell circuit includes four transistors and one photodiode. The pixel operation is divided into three main stages: reset, exposure, and reading.

(1) The reset stage: by turning on the reset and transfer (Tx) transistors, the photodiode capacitance is charged to a reset voltage. As for the case of the p+np buried photodiode shown in FIG. 1, the buried cathode (n) is totally depleted and set to the pinned voltage ($V_{pin}$).

(2) The exposure stage: with the absorption of light by the photodiode, electron and hole pairs are generated. The holes fill the depleted acceptor sites in the p-region, and the electrons fill the depleted donor sites in the n-region. The potential of the photodiode cathode decreases as the photoelectrons fills up at the donor sites.

(3) The reading stage: the pixel value is read out by a correlated double sampling (CDS) circuit. First, the select transistor and the reset transistor are turned on, the floating diffusion (FD) is set to high, and the output is set to the reference level. Then, the transfer transistor (Tx) is turned on, the accumulated photo-electrons in the photodiode are transferred to the FD. Photo-charges in FD are converted to the signal voltage by a source follower (SF) and read out as signal voltage level. The signal is constructed by subtracting the reference voltage level from the signal voltage level (see FIG. 2).

FIG. 2 is a timing diagram associated with of the pixel circuit of FIG. 1 (prior art). The advantage of using a buried photodiode in a CMOS imager sensor is that low dark currents may be obtained. If the charge in the buried n-cathode can be completely depleted during the reset, and the signal electrons in the buried n-cathode can be completely transferred, then zero lag and zero reset noise can be achieved. Several device design parameters optimization such as: low voltage depleted diode, wide transfer transistor, low threshold voltage, and high gate voltage on transfer transistor must be considered to achieve the complete transfer of the signal electrons in the buried n-cathode.

FIG. 3 is a Bayer color filter pattern (prior art). Conventional CMOS and charge-coupled device (CCD) digital image sensors use a standard photodiode or photogate as the photosensing element. In their native state, the photosensing element captures the light signal as black-and-white. In order to perform color imaging, small color filters are placed on top of each photo sensing element. Usually the red, green, and blue (RGB) color filters are arranged in a Bayer pattern, as shown, which alternately samples red, green, and blue pixels.

A required image-processing step for Bayer pattern sensors is interpolation, during which missing data is estimated from neighboring pixel data. Misalignment of the color filter results in color artifacts, and the color filter adds to the cost of the imager. Furthermore, the continuing design pressures to decrease pixel size act to reduce the photodiode sensing area and the signal strength.

One way to prevent the use of color filters and potentially increase the sensing element area is to stack the photo sensing elements (photodiodes). Silicon has characteristic photon absorption lengths that vary with the energy of the photons absorbed. For the wavelengths of 450 nanometers (nm), 550 nm, and 650 nm, the absorption lengths are 0.24 microns (µm), 1.13 µm, and 3.17 µm, respectively. This variation provides an opportunity to fabricate stacked diode junctions at depths that are capable of separating photons of various wavelengths, using standard CMOS manufacturing processes. Various technologies have been applied to this idea over the past 30 years and full color imaging is available in the market place.

In order to provide better resolution, the stacked photodiode set has to be electrically isolated from the adjacent stacked photodiode set. The isolation region is p-type doped region and is connected to the p-region of all pn photodiodes, as well as to ground. There are two ways to fabricate the p-type isolation region. The first is to implant p-type boron into the boundary region between stacked photodiode sets. In order to implant boron into 3 µm deep Si, a high energy implanter and thick photo-resist are needed. Usually, patterned features are relatively large when using thick photo-resist and high energy implant. To implant boron into a 3 µm depth, the lateral penetration standard deviation is more than 0.1 µm. Therefore, a wider isolation region is required, which in turn, limits the imager pixel size. For the 130 nm process technology, the optimized pitch for the thick photo resist and high energy implant process is about 8 µm. These processes limit the fabrication of CMOS imagers using a smaller pixel size. For a conventional CMOS imager with a color filter array (CFA) using 130 nm process technology, the pixel size is about 1.75 µm by 1.75 µm.

Another way to isolate the stacked photodiodes is to use an epitaxial process followed by a p-type boron implant into the boundary region between stacked photodiode sets. Since every epitaxial silicon layer is thin (1-2 µm), a lower energy boron implant, thinner photo resist, smaller patterned features, and smaller pixel sizes can be realized. Usually, two to three silicon epitaxial steps are needed to build up enough thickness for stack photodiode fabrication. However, the integrating of two or three epitaxial layers is very complex. In addition, it is well known the interface between epi layer is a relatively large leakage current source, making a low dark current sensor difficult to fabricate.

In the above-cited parent application entitled, DUAL-PIXEL FULL COLOR CMOS IMAGER, invented by Lee et al., Ser. No. 12/025,618, filed Feb. 4, 2008, the use of two stand-alone pixels for three color detection is presented. For example, the first pixel has one photodiode for green, and the second pixel has two photodiodes built in a stacked structure to detect blue and red. However, without precautions, such a structure may result in significant color overlap between the diodes.

It would be advantageous if a conventional color filter could be used with a two-pixel photodiode array to reduce color overlap between diodes.

SUMMARY OF THE INVENTION

Presented is a color filter to improve the color separation in a CMOS imager using two stand-alone pixels for three color detection. As an example, a green-absorbing filter (also known as a magenta filter) may be added to the stacked photodiode pixel to suppress green light from entering the photodiodes, so the blue and red photodiodes have spectra with depressed green color absorption. A green-transmitting filter may optionally be added to the single photodiode pixel. If no filter is used over the "green" diode, the spectrum of the photoresponse is broad. However, by subtracting the sum of the red and blue diode signals from that of the broad "green" diode, a narrower green color response may be recovered. This subtraction process may be implemented as part of the color conversion algorithms.

More generally, a full color complementary metal oxide semiconductor (CMOS) imaging circuit is provided. The imaging circuit comprises an array of photodiodes including a plurality of pixel groups, where each pixel group supplies 3 electrical color signals, corresponding to 3 detectable colors. The circuit also includes a color filter array overlying the photodiode array employing less than 3 separate filter colors. Each pixel group may be enabled as a dual-pixel including a single photodiode (PD) to supply a first color signal and stacked PDs to supply a second and third color signal.

In one aspect, the color filter array employs 1 filter color per pixel group. In another aspect, the color filter array employees 2 filter colors per pixel group. In either aspect, the color filter array forms a checkerboard pattern of color filter pixels. For example, a magenta color filter may overlie the stacked PDs of each dual-pixel, a green color filter may overlie the single PD of each dual-pixel, or a red color filter may overlie the single PD of each dual-pixel, to name but a few variations.

Additional details of the above-described dual-pixel full color imager circuit and color filter array are provided below.

BRIEF DESCRIPTION OF THE DRAWINGS

FIG. 5 is a partial cross-sectional view of a full color, or tri-color CMOS imaging circuit.

FIG. 6 is a plan view of the color filter array of FIG. 5.

FIGS. 7A through 7I are plan views depicting various examples of the color filter array of FIG. 5, showing the underlying photodiode.

FIG. 10 is an optical absorption simulation of the three-photodiode structural model illustrated in FIG. 9.

FIG. 11 is an optical absorption simulation of the three-photodiode structural model of FIG. 9, with reduced color noise.

DETAILED DESCRIPTION

Figure 1:
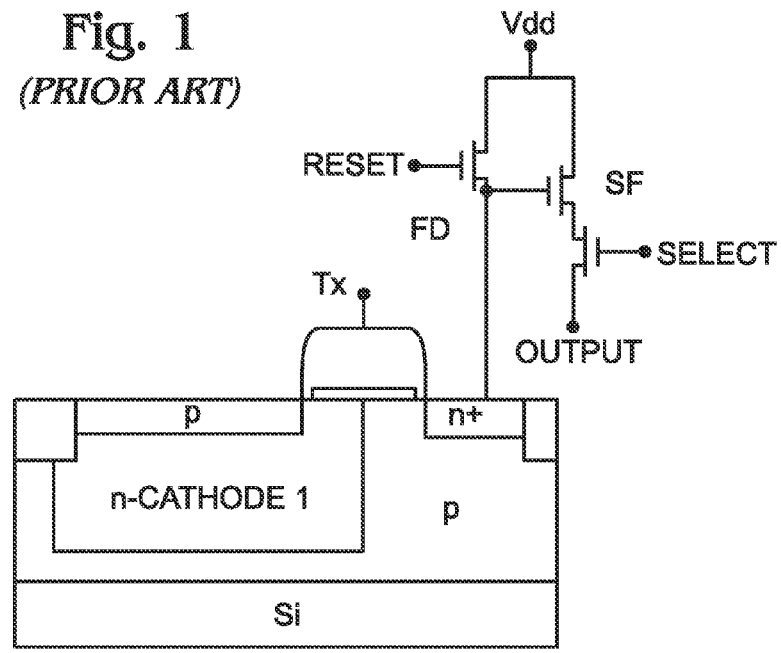
FIG. 1 depicts a complementary metal oxide semiconductor (CMOS) imager with a "buried" or "pinned" photodiode (prior art).
Figure 2:
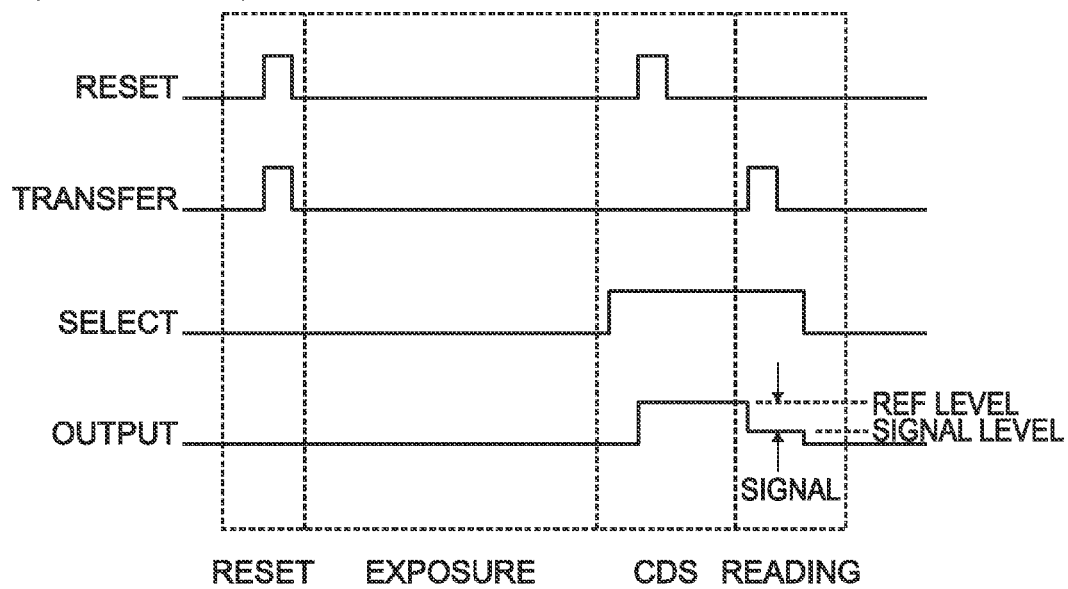
FIG. 2 is a timing diagram associated with of the pixel circuit of FIG. 1 (prior art).
Figure 3:
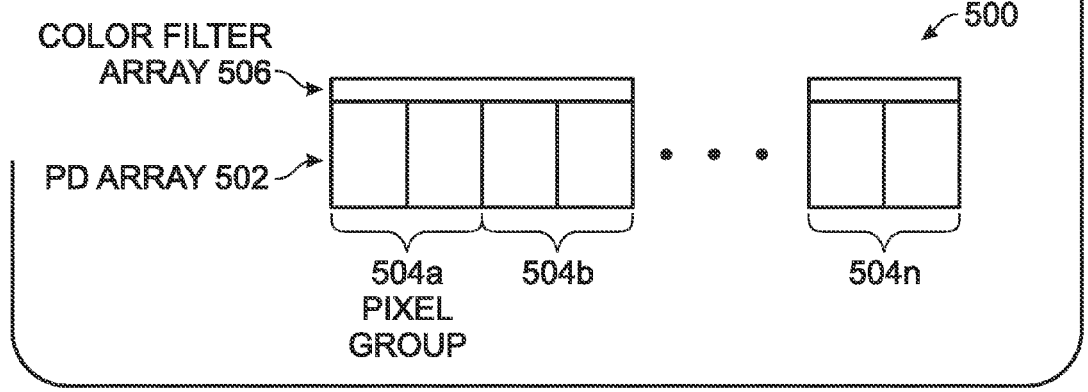
FIG. 3 is a Bayer color filter pattern (prior art).
Figure 4:
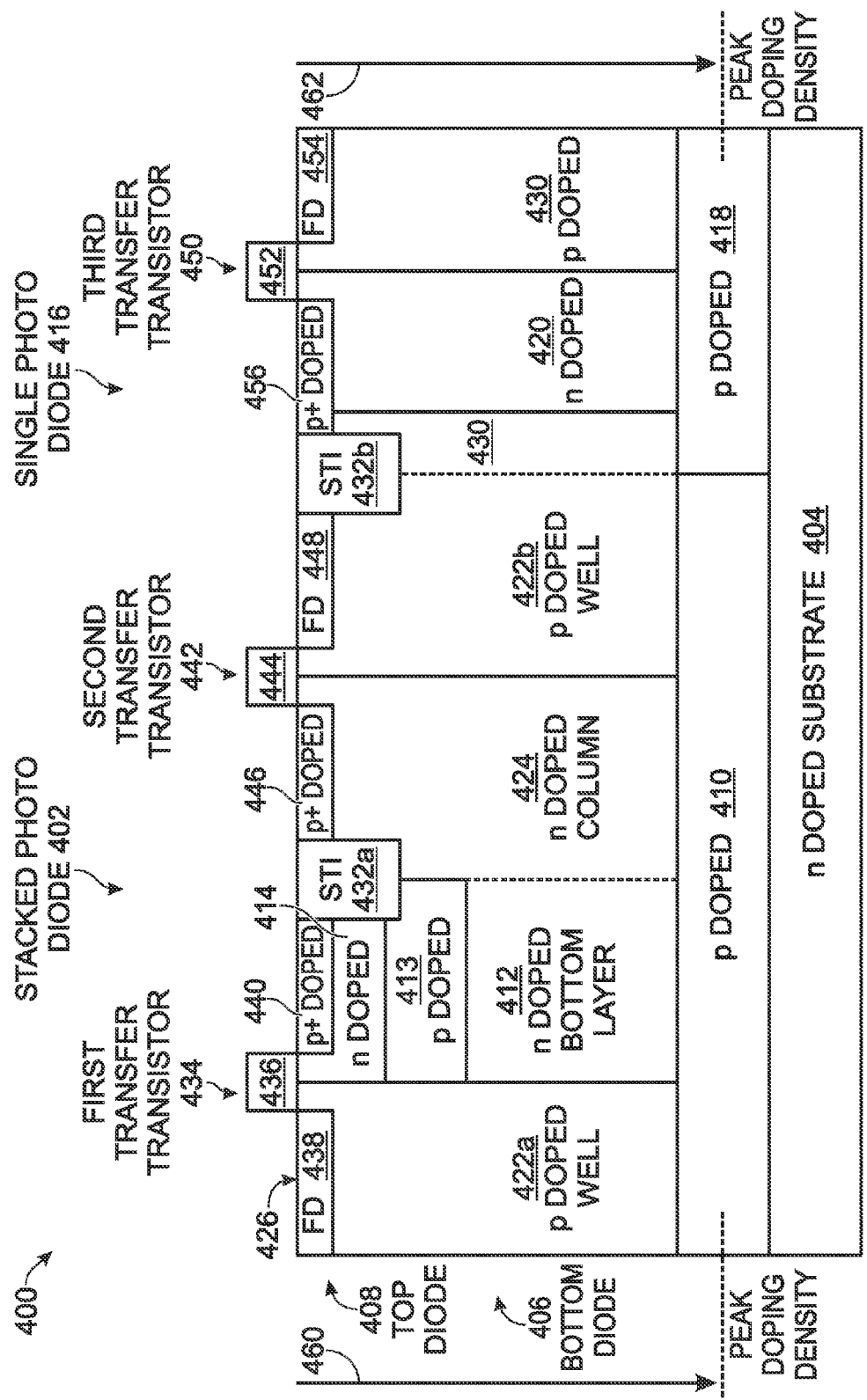
FIG. 4 is a partial cross-sectional view of a dual-pixel full color CMOS imager.

FIG. 4 is a partial cross-sectional view of a dual-pixel full color CMOS imager. The imager 400 comprises a two-photodiode stack 402 including an n doped substrate 404, a bottom photodiode 406, and a top photodiode 408. The bottom photodiode 406 includes a bottom p doped layer 410 overlying the substrate 404 and a bottom n doped layer cathode 412 overlying the bottom p doped layer 410. The top photodiode 408 has a top p doped layer 413 overlying the bottom n doped layer 412 and a top n doped layer cathode 414 overlying the top p doped layer 413. A single photodiode 416 includes the n doped substrate 404, a p doped layer 418 overlying the substrate 404, and an n doped layer cathode 420 overlying the p doped layer 418.

An n doped region, as defined herein, is associated with dopant concentrations in the range of about $1 \times 10^{15}$ to $5 \times 10^{17}$ cm$^{-3}$, the n+ doped floating diffusion areas have dopant concentrations in the range of about $1 \times 10^{19}$ to $1 \times 10^{21}$ cm$^{-3}$. For the p doped regions, the dopant concentrations are the range of about $5 \times 10^{15}$ to $5 \times 10^{17}$ cm$^{-3}$; the p+ surface doped regions have the dopant concentrations in the range of about $5 \times 10^{17}$ to $1 \times 10^{19}$ cm$^{-3}$.

A first p well 422 overlies exterior edges of the bottom p doped layer 410, surrounding the top and bottom diodes 406/408 and connecting the top p doped layer 413 with the bottom p doped layer 410. An n doped vertical column 424 overlies the bottom p doped layer 410, extending to a stack top surface 426, and is adjacent to the first p doped well liner 422 and the bottom n doped layer 412. A second p well 430 overlies exterior edges of the single photodiode p doped layer 418, surrounding the single photodiode 416. The first and second p doped wells are connected to ground. A shallow trench-isolation (STI) layer 432a is interposed between the top n doped layer 414 and the n doped vertical column 424. An STI region 432b is interposed between FD 448 and p+ doped layer 456, residing in p doped well 422b/430. Although p doped well regions 422a and 430 have been described as separate regions, they may alternately be considered as a single region with a shared wall.

A first transfer transistor 434 includes a first gate electrode 436 overlying and interposed between the top n doped layer 414 and a first side of the first p well 422a, an n+ doped floating diffusion (FD) first region 438 overlying the first p well 422, and a p+ doped first surface layer 440 overlying the top n doped layer 414. The p doped first surface layer 440 is connected to the first p doped well 422 and ground. The connections to the first p doped well 422 and ground are not shown.

A second transfer transistor 442 includes a second gate electrode 444 overlying and interposed between a second side of the first p well 422b and the n doped vertical column 424. A p+ doped second surface layer 446 overlies the n doped vertical column 424, and is connected to the first p doped well 422 and ground. The connection between the first p doped well 422 and the p+ doped second surface layer 446 cannot be seen in this view. An n+ floating diffusion region second region 448 overlies the first p well 422b and is connected to the floating diffusion first region 438.

A third transfer transistor 450 includes a third gate electrode 452 overlying and interposed between the n doped layer 420 and the second p well 430. An n+ floating diffusion third region 454 overlies the second p well 430 and is connected to the floating diffusion first and second regions 438/448. A p+ doped third surface layer 456 overlies the n doped layer 420, and is connected to the second p well 430 and ground.

FIG. 5 is a partial cross-sectional view of a full color, or tri-color CMOS imaging circuit. The imaging circuit 500 comprises an array 502 of photodiodes including a plurality of pixel groups 504. Three pixel groups, 504a, 504b, and 504n are shown, where n is not limited to any particular value.

Figure 13:
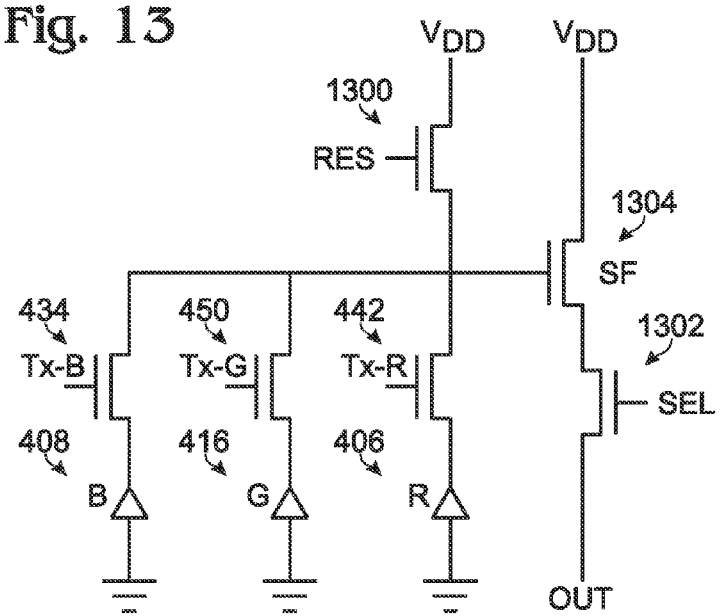
FIG. 13 is a schematic diagram depicting an active pixel sensor (APS) cell circuit, such as might be used to interface with the transfer transistors of FIG. 4.

Each pixel group 504 supplies 3 electrical color signals, corresponding to 3 detectable colors (also see FIG. 13). A color filter array 506 overlies the photodiode array 502 employing less than 3 separate filter colors.

The dual-pixel full color CMOS imager of FIG. 4 is one example of a pixel group. Returning briefly to FIG. 4, a dual-pixel would then be a single photodiode (PD) 416 to supply a first color signal and stacked PDs 402 to supply a second and third color signal.

FIG. 6 is a plan view of the filter array of FIG. 5. In one aspect, the color filter array 506 overlying the photodiode array (not seen) employs 1 filter color per pixel group. Thus, the pixels labeled as "A" would have a filter color, and the pixels labeled as "B" would have no filter color (transparent). In another aspect, the color filter array 506 overlying the photodiode array employs 2 filter colors per pixel group. Thus, the pixels labeled as "A" would have a first filter color, and the pixels labeled as "B" would have a second filter color. In either aspect, the color filter array 506 can be said to form a checkerboard pattern of color filter pixels.

Alternately stated, the color filter array 506 comprises a first plurality of pixels having a first filter color "A", arranged as a checkerboard pattern, a second plurality of pixels "B" arranged as a checkerboard pattern, interposed between the first plurality of pixels. The second plurality of pixels may have a second filter color, different than the first filter color, or they may be transparent, having no color filter. As used herein, a color filter is defined as a color transmitting filter. Thus, a red color filter transmits the color red.

FIGS. 7A through 7I are plan views depicting various examples of the color filter array of FIG. 5, showing the underlying photodiode. As above, the pixel groups are enabled as a single PD/stacked PD set. Each single PD is represented as "S" and each the stacked PDs pixel is represented as "D". In FIG. 7A, a magenta color filter "M" overlies the stacked PDs of each dual-pixel (M/D). A transparent color filter (no color filter), overlies the single PD (S).

In FIG. 7B, a green color filter "G" overlies the single PD of each dual-pixel. A transparent color filter overlies the stacked PDs.

In FIG. 7C, a red color filter "R" overlies the single PD of each dual-pixel. A transparent color filter overlies the stacked PDs.

In FIG. 7D, a blue color filter "B" overlies the single PD of each dual-pixel. A transparent color filter overlies the stacked PDs.

In FIG. 7E, a magenta color filter "M" overlies the stacked PDs of each dual-pixel, and a green color filter "G" overlies the single PD of each dual-pixel.

In FIG. 7F, a cyan color filter "C" overlies the stacked PDs of each dual-pixel and a red color filter "R" overlies the single PD of each dual-pixel.

In FIG. 7G, a yellow color filter "Y" overlies the stacked PDs of each dual-pixel and a blue color filter "B" overlies the single PD of each dual-pixel.

In FIG. 7H, a cyan color filter "C" overlies the stacked PDs of each dual-pixel. A transparent color filter overlies the single PD.

In FIG. 7I, a yellow color filter "Y" overlies the stacked PDs of each dual-pixel. A transparent color filter overlies the single PD.

Considering FIGS. 4, 5, 6, and 7A-7I, in one aspect of the circuit 500, the bottom p doped layer 410 of the stacked photodiode 402 can be formed at the same depth as the p doped layer 418 of the single PD 416. This feature permits the p doped layers to be formed simultaneously, in the same processing step. That is, the stacked PDs 402 include a bottom p doped layer 410 overlying an n doped substrate 404 having a first peak doping density depth 460, and the single PD 416 includes a p doped layer 418 overlying the n doped substrate 404 having a peak doping density depth 462 that is equal to the first peak doping density depth 460.

The stacked diodes inherently separate out colors in response to the natural absorption depths in silicon. In examples 1-9 below, color filters are added over the stacked and/or single diodes that permit the first p-layer implant depth of the stacked and single diodes to be the same.

In one example, the stacked PDs 402 may provide blue (top diode 408) and red (bottom diode 406) color electrical signals, while a magenta color filter overlies the stacked PDs 402. The single PD 416 supplies the green color electrical signal. A transparent color filter (no color filter) overlies the single PD 416.

In a second example, the stacked PDs 402 may provide blue (top diode 408) and green (bottom diode 406) color electrical signals, while a cyan color filter overlies the stacked PDs 402. The single PD 416 supplies the red color electrical signal. A transparent color filter overlies the single PD 416.

In a third example, the stacked PDs 402 may provide green (top diode 408) and red (bottom diode 406) color electrical signals, while a yellow color filter overlies the stacked PDs 402. The single PD 416 supplies the blue color electrical signal. A transparent color filter overlies the single PD 416.

In a fourth example, the stacked PDs 402 may provide blue (top diode 408) and red (bottom diode 406) color electrical signals, while a green color filter overlies the single PD 416. The single PD 416 supplies the green color electrical signal. A transparent color filter overlies the stacked PDs 402.

In a fifth example, the stacked PDs 402 may provide blue (top diode 408) and green (bottom diode 406) color electrical signals, while a red color filter overlies the single PD 416. The single PD 416 supplies the red color electrical signal. A transparent color filter overlies the stacked PDs 402.

In a sixth example, the stacked PDs 402 may provide green (top diode 408) and red (bottom diode 406) color electrical signals, while a blue color filter overlies the single PD 416. The single PD 416 supplies the blue color electrical signal. A transparent color filter overlies the stacked PDs 402.

In a seventh example, the stacked PDs 402 may provide blue (top diode 408) and red (bottom diode 406) color electrical signals, while a green color filter overlies the single PD 416 and a magenta color filter overlies the stacked PDs 402. The single PD 416 supplies the green color electrical signal.

In an eighth example, the stacked PDs 402 may provide blue (top diode 408) and green (bottom diode 406) color electrical signals, while a red color filter overlies the single PD 416 and a cyan color filter overlies the stacked PDs 402. The single PD 416 supplies the red color electrical signal.

In a ninth example, the stacked PDs 402 may provide green (top diode 408) and red (bottom diode 406) color electrical signals, while a blue color filter overlies the single PD 416 and a yellow color filter overlies the stacked PDs 402. The single PD 416 supplies the blue color electrical signal.

In a different aspect, the single PD includes a p doped layer 418 overlying the n doped substrate 404 having a peak doping density depth 462 that is different than the first peak doping density depth 460. For example, depth 462 may be deeper than depth 460. The depths 460/462 are defined with respect to the top surface 426. While requiring separate doping implant steps for the formation of p doped layers 410 and 418, this arrangement inherently provides for color separation between the bottom diode 406 and the single diode 416.

In a tenth example, the stacked PDs 402 may provide blue (top diode 408) and red (bottom diode 406) color electrical signals, while a magenta color filter overlies the stacked PDs 402. The single PD 416 supplies the green color electrical signal. A transparent color filter overlies the single PD 416.

In an eleventh example, the stacked PDs 402 may provide blue (top diode 408) and green (bottom diode 406) color electrical signals, while a cyan color filter overlies the stacked PDs 402. The single PD 416 supplies the red color electrical signal. A transparent color filter overlies the single PD 416.

In a twelfth example, the stacked PDs 402 may provide green (top diode 408) and red (bottom diode 406) color electrical signals, while a yellow color filter overlies the stacked PDs 402. The single PD 416 supplies the blue color electrical signal. A transparent color filter overlies the single PD 416.

Functional Description

Figure 8:
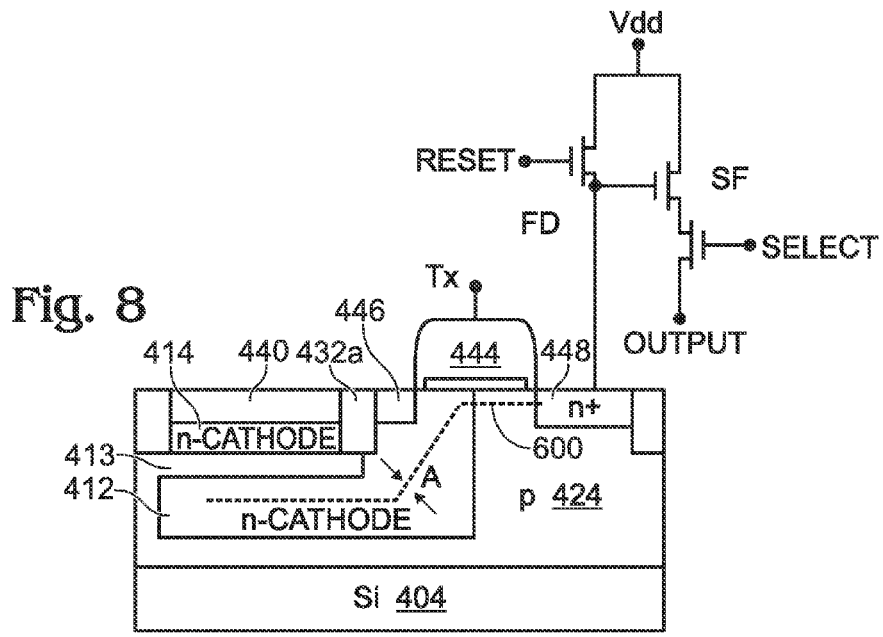
FIG. 8 is a partial cross-section view of the stacked diode of FIG. 4, depicting charge transfer.

FIG. 8 is a partial cross-section view of the stacked diode 402 of FIG. 4, depicting charge transfer. The dual-pixel full color CMOS imager of FIG. 4 has one pixel with a single photodiode and the other pixel with stacked PDs. One challenge of the design concerns the charge transfer of the bottom PD of the stacked PD pixel. As shown in FIG. 8, the stored charges at the bottom n-cathode 412 have to travel up to the transfer transistor channel 600 before reaching the FD 448. The neck or n doped vertical column 424 (shown by the arrows in region A) is very narrow (the drawing is not to scale), and gets narrower with higher cathode voltages as the transfer process continues. The dotted lines represent charge flow. This narrowing neck causes high resistance and charge transfer issues. The color imager of FIG. 4 addresses the charge transfer issue of the bottom PD of the stacked PD pixel with a minimum of process steps.

Figure 9:
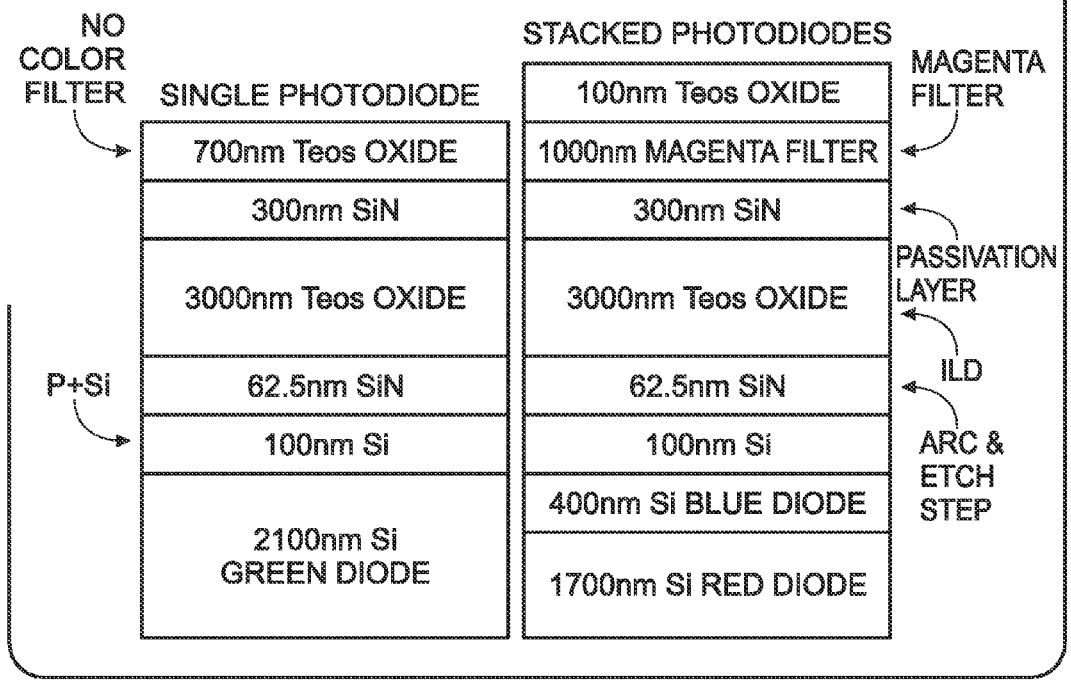
FIG. 9 is a partial cross-sectional view depicting exemplary color filters structures overlying a dual-pixel.

FIG. 9 is a partial cross-sectional view depicting exemplary color filters structures overlying a dual-pixel. It should be understood that the present invention full color circuit and color filter array are not limited to any particular type of color filter structure or material. Other structures and materials are known in the art that are compatible with the full color imaging circuits and color filter arrays described above.

After a front-end-of-the-line (FEOL) process and before the interlevel dielectric (ILD) process, if desired, a thin solid state anti-reflection coating (ARC), designed to enhance green light transition, may be placed on the green diode. The ARC coating may be made with a combination of $SiO_2$ and $Si_3N_4$ layers, for example, which are blanket deposited, patterned, and etched from the blue/red stacked diode. To reduce costs, the ARC could be left as-is on the blue/red diode.

The rest of the fabrication follows standard CMOS imager processing, as is known to those skilled in the art, with ILD, metallization, possible use of an inner lens, and microlens. A magenta color filter is used over the stacked blue/red diode, and either a standard green color filter or no color filter may be used over the green diode. The magenta filter transmits blue and red while absorbing green, enhancing the color separation. Similar processes might be used for the fabrication of different filter colors, or the fabrication of a filter color over both the stacked and single PDs.

FIG. 10 is an optical absorption simulation of the three-photodiode structural model illustrated in FIG. 9. The structures are based on cross-sections of conventional filter structures. No microlenses were modeled, but the effects of an overlying IR cut-off filter (not shown) were included, to remove light above 700 nm. The structure on the left models the green photodiode with a simple ARC (designed for green light) on the Si surface, but no color filter. The structure on the right models the blue and red photodiodes with the use of a magenta filter. Note that the ARC is not removed on this diode, as might be done to reduce fabrication costs.

It can be seen that the response of the green photodiode is very strong, with a maximum of up to 70% absorptance (corresponding to 70% internal quantum efficiency) at a wavelength of 525 nm. However, it is also very wide, covering the entire visible spectrum, approaching a "white" response. The blue and red photodiodes have maximum absorptances of about 35% at wavelengths of 440 nm and 610 nm, respectively. The main peaks are well separated but they each have sub-peaks which infringe on the other's domain. This set of diodes has a strong luminance signal but exhibits some problems with color noise, which can be minimized in software further down in the image processing pipeline.

FIG. 11 is an optical absorption simulation of the three-photodiode structural model of FIG. 9, with reduced color noise. Shown is the result of subtracting the red and blue diode spectra from the original green diode spectrum (FIG. 10) to give a narrower green response. This noise subtraction method is performed in image processing software.

Figure 12:
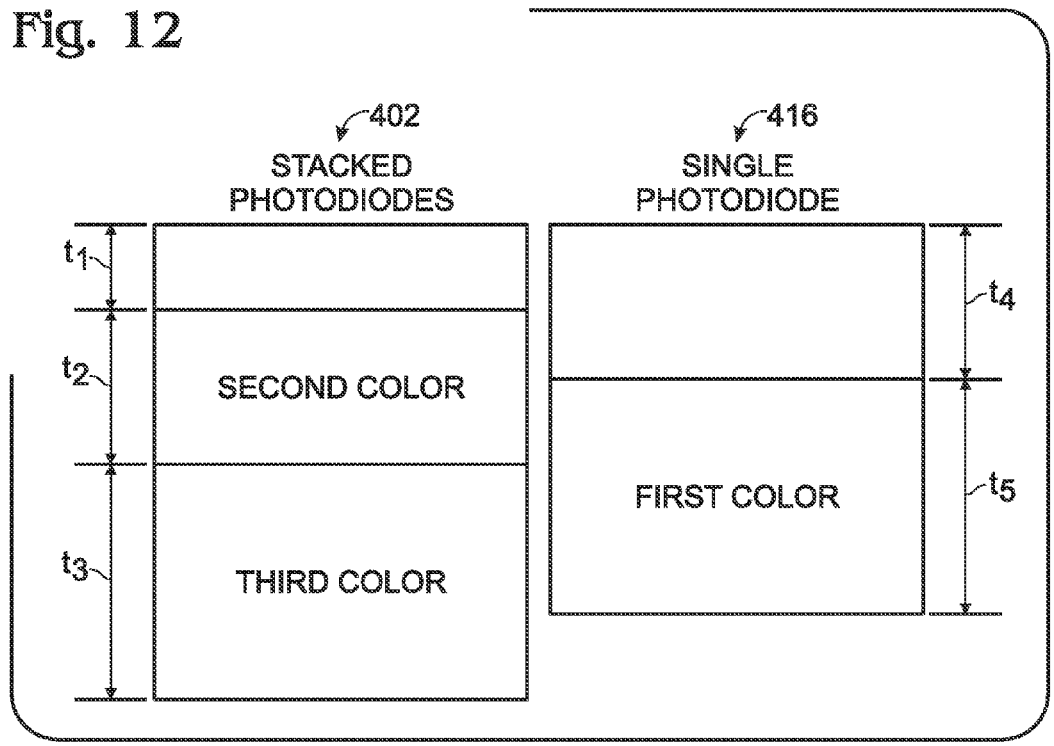
FIG. 12 is a partial cross-sectional view showing p doping implantations in the fabrication of the dual-pixel device of FIG. 4.

FIG. 12 is a partial cross-sectional view showing p doping implantations in the fabrication of the dual-pixel device of FIG. 4. Each dual-pixel includes a stacked photodiodes pixel 402 and a single photodiode pixel 416. The stacked PDs pixel 402 is defined by three implant depths, t1, t1+t2, and t1+t2+t3. The light absorbing regions (and consequent colors) come from regions t2, and t3. For simplicity, the light absorbing regions are identified by the thickness labels. The single PD pixel 416 is similarly defined by two implant depths at t4 and t4+t5, with the light absorbing region being t5.

With respect to FIG. 4, t1 is the depth of the peak doping density of region 440, t1+t2 is the depth of the peak doping density of region 413, and t1+t2+t3 is depth 460. For the single diode, t4 is the depth of the peak doping density of region 456, and t4+t5 is the depth 462.

The range of these thicknesses (in nm) is given in the following tables for nine combinations of single color filters and double color filters. For ease of manufacturing, the depths for the stacked PDs and single PD can be made to be compatible.

Table 1 is a summary of examples 4-6, and corresponding FIGS. 7B, 7C, and 7D.

TABLE 1

| One color filter on Single PD | | | | | | |
|---|---|---|---|---|---|---|
| Stacked PD Colors (t2 & t3) | t1 | t2 | t3 | Single PD Filter (t5) | t4 | t5 |
| B & R | 20-100 | 300-500 | 1500-2500 | Green | t1 | t2 + t3 |
| B & G | 20-100 | 300-500 | 1200-1600 | Red | t1 | t2 + t3 |
| G & R | 200-400 | 400-700 | 1500-2500 | Blue | 20-100 | t2 + t3 |

Table 2 summarizes examples 1, 2, 3, 10, 11, and 12, and corresponding FIGS. 7A, 7H, and 7I. As shown in Table 2, fabrication steps can be minimized by setting t4 equal to t1, and t5 equal to t2+t3. The bold type in Tables 2 and 3 describe embodiments that exhibit excellent color separation.

TABLE 2

One color filter on Stacked PDs

| Stacked PD Colors (t2 & t3) | Filter on Stacked PDs | t1 | t2 | t3 | Single PD Color (t5) | t4 | t5 |
|---|---|---|---|---|---|---|---|
| B & R | Magenta | 20-100 | 300-500 | 1500-2500 | Green | 300-500 | 1000-2000 |
| B & G | Cyan | 20-100 | 300-500 | 1200-2500 | Red | 600-1000 | 1000-2000 |
| G & R | Yellow | 20-100 | 400-700 | 1500-2500 | Blue | 20-100 | 300-500 |

Table 3 summarizes examples 7, 8, and 9, and corresponding FIGS. 7E, 7F, and 7G.

TABLE 3

Color Filters on both Stacked and Single PDs

| Stacked PD Colors (t2 & t3) | Filter on Stacked PDs | t1 | t2 | t3 | Single PD Filter (t5) | t4 | t5 |
|---|---|---|---|---|---|---|---|
| B & R | Magenta | 20-100 | 300-500 | 1500-2500 | Green | $t_1$ | t2 + t3 |
| B & G | Cyan | 20-100 | 300-500 | 1200-2500 | Red | $t_1$ | t2 + t3 |
| G & R | Yellow | 20-100 | 400-700 | 1500-2500 | Blue | $t_1$ | t2 + t3 |

FIG. 13 is a schematic diagram depicting an active pixel sensor (APS) cell circuit, such as might be used to interface with the transfer transistors of FIG. 4. The transfer transistors are 434 (Tx-B), 450 (Tx-G), and 442 (Tx-R). For this example, the photodiodes are 406 (R), 416(G), and 408 (B). The reset (Res) 1300, select (Sel) 1302, and source follower (SF) 1304 transistors may be fabricated on the p-wells.

A dual-pixel full color CMOS imaging circuit and color filter array have been presented. Examples of explicit structural details and process steps have been provided to illustrate the invention. However, the invention is not limited to just these examples. Other variations and embodiments of the invention will occur to those skilled in the art.

We claim:

1. A full color complementary metal oxide semiconductor (CMOS) imaging circuit comprising:
   an array of photodiodes including a plurality of pixel groups, each pixel group supplying 3 electrical color signals, corresponding to 3 detectable colors, wherein each pixel group is a dual-pixel including a single photodiode (PD) to supply a first color signal and stacked PDs to supply a second and third color signal, and wherein the plurality of dual-pixels form a checkerboard pattern of single and stacked PDs; and,
   a color filter array overlying the photodiode array, wherein the color filer overlying the single PD of each dual-pixel is selected from a group consisting of green, blue, and red color filters.

2. The color imaging circuit of claim 1 wherein the stacked PDs provide color electrical signals selected from a group consisting of blue and red, blue and green, and green and red, and include a bottom p doped layer overlying an n doped substrate having a first peak doping density depth, and wherein the single PD includes a p doped layer overlying the n doped substrate having the second peak doping density depth different than the first peak doping density depth; and,
   wherein the color filter array includes a color filter selected from a group consisting of magenta, cyan, and yellow, respectively overlying the stacked PDs.

3. The color imaging circuit of claim 1 wherein the stacked PDs provide color electrical signals selected from a group consisting of blue and red, blue and green, and green and red, and include a bottom p doped layer overlying an n doped substrate having a first peak doping density depth, and wherein the single PD includes a p doped layer overlying the n doped substrate having the first peak doping density depth; and,
   wherein the color filter array includes a color filter selected from a group consisting of magenta, cyan, and yellow, respectively overlying the stacked PDs.

4. The color imaging circuit of claim 1 wherein a magenta color filter overlies the stacked PDs of each dual-pixel.

5. The color imaging circuit of claim 1 wherein a cyan color filter overlies the stacked PDs of each dual-pixel.

6. The color imaging circuit of claim 1 wherein a yellow color filter overlies the stacked PDs of each dual-pixel.

7. The color imaging circuit of claim 1 wherein the color filter array overlying the photodiode array includes a transparent color filter overlying the stacked PDs.

8. The color imaging circuit of claim 1 wherein the color filter array overlying the photodiode array includes a magenta color filter overlying the stacked PDs and a green color filter overlying each single PD.

9. The color imaging circuit of claim 1 wherein the color filter array overlying the photodiode array includes a cyan color filter overlying the stacked PDs and a red color filter overlying each single PD.

10. The color imaging circuit of claim 1 wherein the color filter array overlying the photodiode array includes a yellow color filter overlying the stacked PDs and a blue color filter overlying each single PD.

11. A full color complementary metal oxide semiconductor (CMOS) imaging circuit comprising:
    an array of photodiodes including a plurality of pixel groups, each pixel group supplying 3 electrical color signals, corresponding to 3 detectable colors, wherein each pixel group is a dual-pixel including a single photodiode (PD) to supply a first color signal and stacked PDs to supply a second and third color signal, and wherein the plurality of dual-pixels form a checkerboard pattern of single and stacked PDs; and, a color filter array overlying the photodiode array, wherein the color filer overlying the stacked PDs of each dual-pixel is selected from a group consisting of magenta, cyan, and yellow color filters.

12. The color imaging circuit of claim 11 wherein the color filter array overlying the photodiode array includes a transparent color filter overlying each single PD.

13. The color imaging circuit of claim 11 wherein the stacked PDs provide color electrical signals selected from a group consisting of blue and red, blue and green, and green and red, and include a bottom p doped layer overlying an n doped substrate having a first peak doping density depth, and wherein the single PD includes a p doped layer overlying the n doped substrate having the second peak doping density depth different than the first peak doping density depth; and, wherein the color filter array includes a color filter selected from a group consisting of magenta, cyan, and yellow, respectively overlying the stacked PDs.

14. The color imaging circuit of claim 11 wherein the stacked PDs provide color electrical signals selected from a group consisting of blue and red, blue and green, and green and red, and include a bottom p doped layer overlying an n doped substrate having a first peak doping density depth, and wherein the single PD includes a p doped layer overlying the n doped substrate having the first peak doping density depth; and, wherein the color filter array includes a color filter selected from a group consisting of magenta, cyan, and yellow, respectively overlying the stacked PDs.

15. The color imaging circuit of claim 11 wherein the stacked PDs provide color electrical signals selected from a group consisting of blue and red, blue and green, and green and red, and include a bottom p doped layer overlying an n doped substrate having a first peak doping density depth, and wherein the single PD includes a p doped layer overlying the n doped substrate having the first peak doping density depth; and, wherein the color filter array includes a color filter selected from a group consisting of green, red, and blue, respectively overlying the single PD.

\* \* \* \* \*